United States Patent [19]

White et al.

[11] 4,342,631
[45] Aug. 3, 1982

[54] GASLESS ION PLATING PROCESS AND APPARATUS

[75] Inventors: Gerald W. White, Dallas, Tex.; Jack C. Volkers, Elgin, Ill.

[73] Assignee: Illinois Tool Works Inc., Chicago, Ill.

[21] Appl. No.: 160,045

[22] Filed: Jun. 16, 1980

[51] Int. Cl.³ .......................... C23C 15/00; B05B 5/00; C23C 13/00
[52] U.S. Cl. ............... 204/192 N; 118/621; 118/726; 118/730; 118/50.1; 427/38; 427/39; 204/298
[58] Field of Search ............. 204/192 N, 298; 427/38, 427/39; 118/621, 715, 726, 730, 50.1

[56] References Cited

U.S. PATENT DOCUMENTS

| 4,016,389 | 4/1977 | White | 219/10.49 |
| 4,039,416 | 8/1977 | White | 204/192 N |
| 4,096,026 | 6/1978 | Takeuchi | 156/656 |

FOREIGN PATENT DOCUMENTS 52-22830  6/1977  Japan ............................. 204/192 N

*Primary Examiner*—Aaron Weisstuch
*Attorney, Agent, or Firm*—Jerold M. Forsberg; Thomas W. Buckman

[57] ABSTRACT

There is disclosed a new and improved gasless ion plating apparatus and process which eliminates the prior need for electrically isolating the substrate from the evacuated chamber in which the plating process is performed. In accordance with a disclosed embodiment, one or more substrates to be plated are placed within the chamber. Also within the chamber there is disposed a plating source which includes plating material. The chamber is evacuated and the plating material is heated to vaporize the plating material. Radio frequency energy is applied to the plating source to form a plasma of positively charged plating ions from the vaporized plating material. A positive direct current bias is developed on the plating source relative to the substrates by, for example, applying a direct current positive voltage to the plating source to create an electrical field between the source and substrates for accelerating the plating ions towards the substrates for plating the same.

40 Claims, 5 Drawing Figures

GASLESS ION PLATING PROCESS AND APPARATUS

BACKGROUND OF THE INVENTION

The present invention is directed generally to ion plating, and more particularly to an improved gasless ion plating process and apparatus.

Ion plating is becoming well known in the art. It has been found to be particularly advantageous because the plating process is three-dimensional, allowing a substrate of virtually any shape or configuration to be uniformly plated with plating material. By utilizing gasless ion plating, most any type of material, both conductive and non-conductive, may be plated without requiring drastic alterations of plating parameters. Furthermore, the adherence between the plated material and the substrate has been found to be far superior to that obtainable with other plating processes.

Prior art gasless ion plating processes, such as that disclosed in White, U.S. Pat. No. 4,039,416, contemplate the carrying out of the ion plating process in an evacuated chamber wherein the substrate to be plated is placed. The substrate is first placed into the chamber and then the chamber is evacuated. Within the chamber there is disposed a plating source including plating material and means for heating and vaporizing the plating material. One such plating source is fully described in White, U.S. Pat. No. 4,016,389, and is referred to as a high rate ion plating source. This source includes a crucible in which the plating material is placed and a coil wound about the crucible. The center of the coil is connected to ground potential and the coil ends are connected to an alternating current power source. The power source and coil heat the crucible to melt, vaporize and partially ionize the plating material.

As the plating material is vaporized, a radio frequency power supply coupled to the substrate to be plated creates a plasma of positively charged plating ions from the vaporized plating material about the substrate. A negative direct current bias is developed on the substrate by either applying a direct current negative voltage directly to the substrate in the case of a conductive substrate or in the case of a non-conductive substrate, by relying upon the self-biasing effect of the substrate by virtue of the radio frequency field within the chamber. The negative bias on the substrate causes the positive plating ions to be accelerated toward the substrate for plating the substrate.

While gasless ion plating processes of the type described above have been found to be extremely useful and to exhibit advantages over other plating processes, there remains substantial room for improvement therein for carrying out such a process on a mass production type basis. For example, prior gasless ion plating processes have required the substrate and substrate support means to be electrically insulated or isolated from any portion of the chamber by virtue of the fact that the chamber is preferably connected to ground potential to eliminate the electrical shock hazard to which operating personnel would otherwise be exposed. As can be appreciated, such electrical isolation is required due to the fact that radio frequency energy and a negative direct current voltage is applied directly to the substrate support means.

In mass production environments, it is desirable to vary the orientation of the substrates during the plating process to assure plating of the entire substrate to a uniform thickness. This is commonly accomplished by rotating the individual carriers upon which the substrates rest. Because the substrates must be electrically isolated from the chamber or any portion thereof, specialized insulating bearing elements are required to provide the required movement of the substrates while maintaining the required electrical isolation between the substrate and any portion of the chamber. Furthermore, in order to impress the required negative direct current voltage on the substrates, a commutator ring has been utilized. The commutator ring is connected to the required radio frequency signal and negative voltage and to the individual substrates by a slip-type connection. This system can cause intermittent biasing and consumes valuable space within the chamber. Additionally, the resulting required power fed through into the vacuum system as well as the extreme number of moving parts required create the possibility of malfunction and failures.

It is therefore a general object of the present invention to provide a new and improved gasless ion plating process and apparatus.

It is another object of the present invention to provide such a process and apparatus wherein electrical isolation is not required between the substrates to be plated and any portion of the chamber.

It is a still further object of the present invention to provide an improved gasless ion plating process and method wherein the electric field within the chamber for accelerating the positively charged plating ions toward the substrates is produced by developing a positive direct current bias on the plating source.

It is a still further object of the present invention to provide such a gasless ion plating process and method wherein radio frequency energy is applied to the plating source as opposed to being applied to the substrates to thereby eliminate the heretofore required commutator rings or the like.

SUMMARY OF THE INVENTION

The invention therefore provides a process for ion plating a substrate within a chamber with a plating material comprising the steps of evacuating the chamber, vaporizing plating material in the evacuated chamber from a plating source, applying radio frequency energy to the plating source to create a plasma of plating ions about the substrate, and developing a direct current positive bias on the plating source.

The present invention further provides a new and improved process for ion plating a plurality of substrates within a chamber with a plating material, wherein an electrical field is developed between the substrates and the plating source for accelerating positive plating ions toward the substrates while eliminating the heretofore required electrical isolation between the substrate supporting means and any portion of the chamber. The process comprises the steps of evacuating the chamber, vaporizing plating material in the evacuated chamber from a plating source, applying radio frequency energy to the plating source to form a plasma of the positive plating ions within the chamber, and developing a direct current positive voltage on the plating source to develop an electrical field between the plating source and the substrates for accelerating the positive plating ions toward the substrates.

The present invention still further provides an apparatus for plating a substrate with plating material comprising a chamber adapted to enclose the substrate, plating source means within the chamber for vaporizing plating material therein, means for evacuating the chamber, radio frequency signal generating means coupled to the plating source, means for applying radio frequency energy to the plating source, means to form a plasma of positive plating ions from the vaporized plating material, and means for developing an electrical field between the plating source means and the substrate for accelerating the positive plating ions towards the substrate.

The present invention still further provides in an apparatus for ion plating a plurality of substrates with positive plating ions from a plating source wherein the substrates are enclosed within an evacuated chamber, and wherein an electrical field is developed between the substrates and the plating source for accelerating the positive ions to the substrates, an improved arrangement for creating a plasma of positive plating ions and the ion acceleration field while eliminating the heretofore required electrical isolation between the substrates and any portion of the chamber. The improvement comprises radio frequency signal generating means coupled to the plating source for forming the plasma of positive plating ions and positive direct current voltage source means coupled to the plating source for impressing a positive direct current bias on the plating source for developing the ion acceleration field.

BRIEF DESCRIPTION OF THE DRAWINGS

The features of the present invention which are believed to be novel are set forth with particularity in the appended claims. The invention, together with the further objects and advantages thereof, may best be understood by making reference to the following description taken in conjunction with the accompanying drawing, in the several figures of which like reference numerals identify identical elements, and wherein:

DESCRIPTION OF THE PREFERRED EMBODIMENTS

Figure 1:
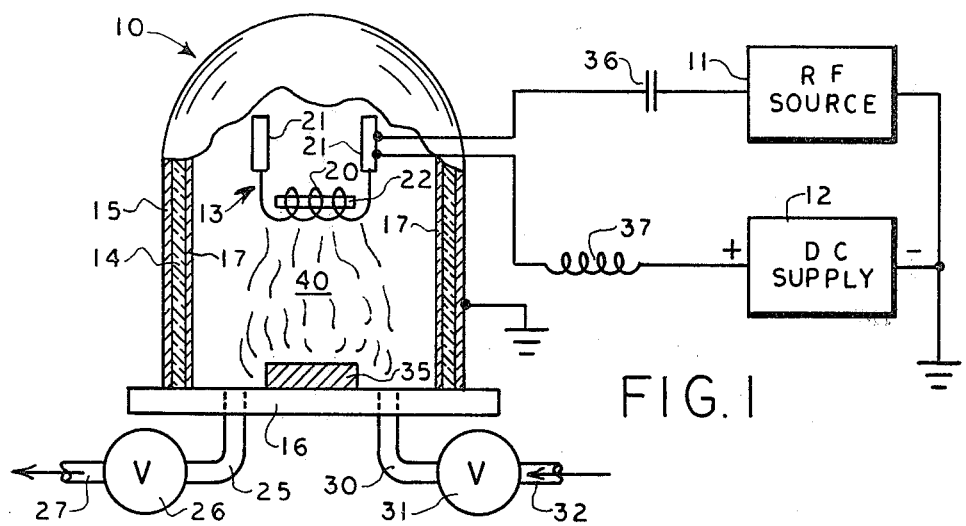
FIG. 1 is a generally schematic representation of a gasless ion plating apparatus embodying the present invention with portions in cross section and cut away.

Referring now to FIG. 1, the gasless ion plating apparatus there illustrated in accordance with a first embodiment of the present invention generally includes a chamber 10, a radio frequency signal generating means 11, a direct current positive voltage source means 12, and a plating source means 13. The chamber 10 comprises a composite structure of a glass bell jar 14 having an outer metallic shield 15 and a conductive coating 17 on its inner surface. The chamber 10 also has a conductive bottom wall 16 which engages the lower margins of the bell jar 14 in airtight relation to allow the interior of the bell jar 14 to be evacuated. The outer metallic shield 15, inner coating 17 and bottom wall 16 are all coupled to ground potential.

The plating source means 13 includes a vaporizing means in the form of a resistance heating element 20, conductive support means 21 and a bar of plating material 22. The resistance heating element 20 takes the form of a coiled wire arranged to receive the bar of plating material 22 therein. The conductive support means 21 take the form of copper rods and are arranged to support the resistance heating element 20 within the chamber 10.

A conduit 25 communicates with the interior of the chamber 10 and is connected to a vacuum pump (not shown) by a valve 26 and another conduit 27. The conduit 25 and 27 and the valve 26 permit the vacuum pump to evacuate the interior of the chamber 10 to an internal pressure of approximately $10^{-5}$ Torr, suitable for the gasless ion plating process.

Another conduit 30 also communicates with the interior of the chamber 10 and is coupled to a source of inert gas (not shown) by another valve 31 and conduit 32. The conduits 30 and 32 and valve 31 permit inert gas, such as argon, to be admitted into the chamber 10 for the purpose of cleaning the substrate or substrates to be plated prior to the plating process in a manner to be described hereinafter.

Resting upon the bottom wall 16 of the chamber 10 is the substrate 35 to be plated. The substrate 35, as will be noted, is not electrically isolated from the bottom wall 16 of the chamber even though the chamber is at ground potential by virtue of the outer shield 15 being coupled to ground as illustrated.

The radio frequency source 11 is coupled between ground and the plating source 13 by being coupled to one of the conductive supports 21 by a capacitor 36. The direct current voltage source 12 is also coupled between ground and the plating source 13. More specifically, the negative terminal of the supply 12 is coupled to ground and the positive terminal is coupled to the conductive support 21 by an inductor 37. As will be appreciated by those skilled in the art, the capacitor 36 and inductor 37 are provided for filtering purposes.

In operation, and in accordance with the process of the present invention, the apparatus of FIG. 1 is operated in the following manner for ion plating the substrate 35. Initially, if the substrate 35 is to be cleaned prior to plating, the chamber 10 is first evacuated by the vacuum pump through the valve 26. Thereafter, inert gas such as argon is admitted to the interior of the chamber 10 through the metering valve 31. After the inert gas is admitted to the chamber, the radio frequency source 11 is energized to apply a radio frequency field to the interior of the chamber 10. This causes back sputtering within the chamber 10 to clean the surfaces of the substrate 35 to be plated.

Once the substrate is cleaned by the process just described, the inert gas is pumped from the chamber 10 through the valve 26 until the interior of the chamber 10 is once again evacuated. The radio frequency source remains energized; or, in the case of a substrate which was not cleaned by backsputtering, the radio frequency source is energized following initial evacuation.

The direct current positive voltage source means 12 is energized to develop a positive bias on the plating source. That positive bias is developed by the positive direct current voltage from the direct current supply 12 which is coupled to the plating source 13 at the conductive support 21. As previously mentioned, the direct current supply 12 is coupled to the plating source 13 through the inductor 37.

Thereafter, a current is applied to the conductive supports 21 to cause the resistance heating element 20 to heat up. The current applied to the conductive supports 21 may be 60 cycle alternating current with the voltage differential from one end of the resistance heating element 20 to the other being in the order of 20 volts. As the resistance heating element 20 heats up to the vaporizing temperature of the plating material 22, the plating material 22 will melt and vaporize upon being in contact with the resistance heating element 20. The plating material 22 may be, for example, copper.

While the plating source 13 contemplated herein comprises a resistance heating element, it will be appreciated by those skilled in the art that other forms of plating sources may also be utilized. For example, a boat device or the previously referred to high rate ion plating source or any other known vaporizing sources may be utilized without departing from the principles of this invention.

The radio frequency signal generating means 11 is preferably of the type capable of providing a radio frequency signal having a frequency of approximately 13.5 megahertz. However, as will be appreciated by those skilled in the art, the radio frequency energy applied to the plating source could be any frequency within the range of approximately 2 to 40 megahertz. While plating could be accomplished at frequencies below 2 megahertz and above 40 megahertz, the efficiency of such a plating system would likely be lower than that obtainable by using a radio frequency source in the range of 2 to 40 megahertz.

Because the radio frequency source 11 is coupled to the conductive support 21, which is also coupled to the resistance heating element 20, the radio frequency energy applied thereto will be radiated by the support 21 and the resistance heating element 20. The RF energy radiated by the plating source 13 creates a plasma 40 of positive plating ions from the vaporized plating material 22 about the substrate 35.

Because the plating source 13 is biased positive with respect to the substrate 35, and more particularly with respect to the surface of the substrate 35, an electrical field is developed between the plating source 13 and the substrate 35. This electrical field accelerates the positive plating ions within the plasma 40 towards the substrate 35.

By virtue of the improved apparatus of FIG. 1, it will be noted that the substrate 35 is not isolated from any portion of the chamber 10. Because the substrate 35 may be conductive and at ground potential, there is no need to electrically isolate this substrate from the chamber as has been required in prior gasless ion plating processes and apparatuses. Furthermore, the substrate 35 could have been just as well an insulative substrate. Although the self biasing effect of an insulative substrate by virtue of the radio frequency field within the chamber 10 would increase the potential difference between the plating source 13 and the substrate 35, that increase in electrical potential is in the proper sense for accelerating the positive plating ions toward the substrate 35. Hence, the apparatus of FIG. 1 may be utilized for ion plating both conductive and insulative substrates.

Figure 2:
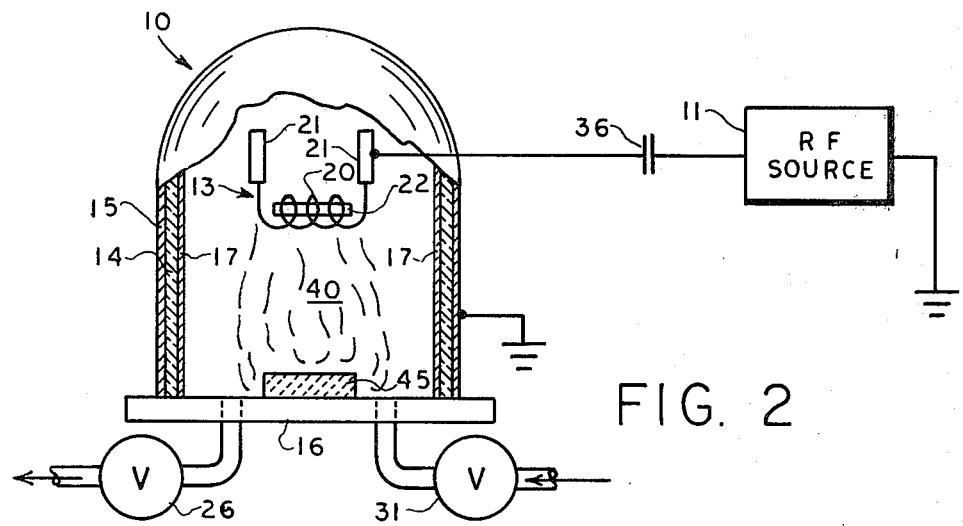
FIG. 2 is another generally schematic representation of a gasless ion plating apparatus in accordance with a further embodiment of the present invention for plating an insulative substrate.

The apparatus of FIG. 2 is substantially identical to the apparatus of FIG. 1 except that the direct current supply 12 and inductor 37 have been eliminated so that the illustrated apparatus is particularly adapted for ion plating an insulative substrate 45. As in the case of the embodiment of FIG. 1, the apparatus of FIG. 2 comprises the chamber 10, the radio frequency signal generating means 11, and the plating source 13. The chamber 10 includes a bottom wall 16 and a glass bell jar 14 having an outer metallic shield 15 and an inner conductive coating 17. The plating source 13 includes the resistance heating element 20 and the conductive supports 21 which support the resistance heating element 20 within the chamber 10. Received within the resistance heating element 20 is the plating material 22, such as copper.

The radio frequency source 11 is coupled between ground potential and the conductive support 21 by the capacitor 36. The insulative substrate to be plated is positioned on the bottom wall 16 as shown.

In operation of the apparatus of FIG. 2, the chamber 10 is first evacuated through the metering valve 26. The radio frequency source 11 is then energized to apply radio frequency energy to the plating source 13 at the resistance heating element 20 and the conductive support 21. Next, current is applied to the conductive supports 21 to cause the heating resistance element 20 to heat up to melt and vaporize the plating material 22. By virtue of the radio frequency field developed within the chamber 10 by the radio frequency energy radiated from the element 20 and support 21, a plasma of positive plating ions 40 is developed about the substrate 45. By virtue of the self biasing effect which occurs when an insulator such as substrate 45 is placed within a radio frequency field, the surface of the substrate 45 will become negatively charged so that a positive bias is developed on the plating source 13 with respect to the surface of the substrate 45. The self biasing effect of substrate 45 takes place because the free electrons, which have been created by thermionic emissions, ionization, etc., and which are pulsed by the radio frequency field in the chamber, strike the substrate 45, lose their kinetic energy and are trapped on the substrate. These electrons thus build up on the surface of the insulative substrate, effecting a negative potential to the substrate relative to the source. As a result, the previously referred to positive bias of the plating source is developed relative to the substrate 45. The electrical field which results by the positive bias developed on the source 13 relative to the substrate 45 causes the positive plating ions within the plasma 40 to be accelerated to the substrate 45 and plate the surface of the substrate 45.

As with the embodiment of FIG. 1, the valve 31 is provided to admit into the chamber an inert gas prior to the plating process for the purpose of cleaning the substrate 45. That process would be identical to the cleaning process described with respect to FIG. 1.

Figure 3:
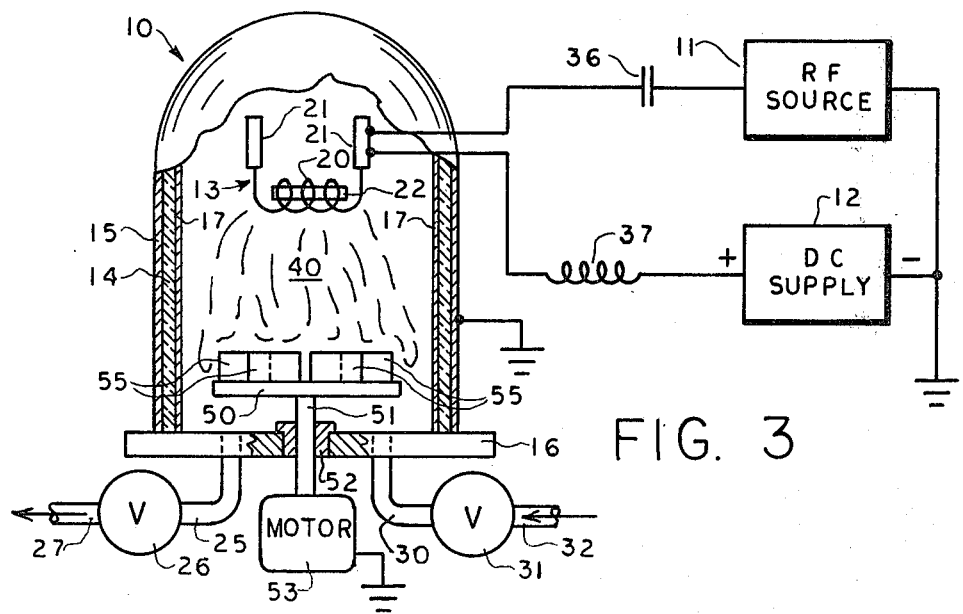
FIG. 3 is a further generally schematic representation of a gasless ion plating apparatus constructed in accordance with the present invention and more particularly including means for varying the orientation of the substrates relative to the plating source during the plating process.

Referring now to FIG. 3, it will be noted that the apparatus there illustrated is substantially similar to the apparatus of FIG. 1 with the exception that additional structure has been added to facilitate the plating of a plurality of substrates. More specifically, it will be noted that a rotatable platform 50 has been provided for supporting a plurality of substrates 55 to be plated within the chamber 10. The platform 50 is generally disc-shaped and includes a supporting shaft 51 which extends through a suitable bearing 52. The shaft 51, at its end opposite the platform 50, is coupled to a motor 53 which, when energized, causes the shaft 51 and platform 50 to rotate. As a result, during the plating process within the chamber 10, the orientation of the substrates 55 may be varied with respect to the plating source 13. While gasless ion plating is a three-dimensional process, the varying of the orientation of the substrates 55 with respect to the plating source 13 further promotes the plating of the substrate surfaces to a uniform depth.

As in the embodiment of FIG. 1, the apparatus of FIG. 3, includes a plating source 13 which comprises the resistance heating element 20, the conductive supports 21 for the element 20, and the plating material 22. The direct current supply 12 and the radio frequency energy source 11 are both coupled to one of the conductive supports 21. The radio frequency energy source 11 is coupled to the support 21 by the capacitor 36 and the direct current voltage supply 12 is coupled to the support 21 by the inductor 37. It will also be noted that the positive side of the direct current voltage supply 12 is coupled to the conductive support 21 to impress a positive bias onto the plating source 13 to establish the positive plating ion acceleration electrical field between the plating source 13 and the substrate 55.

As in the previous embodiments, the metallic shield 15 and the inner coating 17 of the bell jar 14 are coupled to ground and no provision has been made to electrically isolate the substrate 55 from the chamber in any way. This, of course, is due to the fact that such electrical isolation is unnecessary because of the positive direct current bias developed on the plating source 13 relative to the surfaces of the substrates 55. In fact, it is contemplated that the platform 50, shaft 51, and even the bearing element 52 may be formed from metallic material to thereby place these elements at ground potential. Hence, by virtue of the present invention, an applied negative direct current bias to the substrates is no longer necessary to effect plating thereof and thus, the substrates 55 and their supporting structure within the chamber 10 need not be isolated from any portion of the chamber.

In the operation of the apparatus of FIG. 3, should the substrates 55 require cleaning prior to the plating process, the chamber 10 is first evacuated through the metering valve 26. Thereafter, a quantity of inert gas, such as argon, is admitted to the interior of the chamber 10 through the metering valve 31. Then, the radio frequency energy source 11 is energized to apply a radio frequency signal to the conductive support 21 and heating element 20 of the plating source 13 to develop a radio frequency field within the chamber 10. This results in the performance of back sputtering within the chamber 10 to clean the surfaces of the substrates 55. During the back sputtering process, the motor 53 may be energized so as to rotate the platform 50 and vary the orientation of the substrates 55 to effect more uniform cleaning of the substrate surfaces.

After the substrates have been cleaned, the inert gas within the chamber 10 is exhausted through the metering valve 26. After the interior of the chamber 10 has been evacuated, an electrical current is applied to the conductive supports 21 and thus to the resistance heating element 20. Then, the radio frequency source 11 and direct current voltage supply 12 are energized, along with the motor 53. The heating of the element 20 causes the plating material 22 to melt and vaporize within the chamber 10. As in the previous embodiment, the radio frequency signal generating means 11 applies radio frequency energy to the conductive support 21 and heating element 20 to cause the same to radiate the radio frequency energy within the chamber 10 to establish a radio frequency field therein. The radio frequency field within the chamber 10 creates a plasma 40 of positive plating ions from the vaporized plating material 22 which plasma 40 extends from the plating source 13 to and about the substrates 55. The positive direct current voltage potential applied to the plating source 13 by the supply 12 develops a positive direct current bias on the plating source 13 with respect to the substrates 55 to develop the required electrical field for accelerating the positive plating ions to the substrates 55 to effect plating thereof.

During the plating process, the motor 53 drives the shaft 51 to rotate the platform 50 to vary the orientation of the substrates 55 relative to the plating source. As previously mentioned, this assures plating of the substrate surfaces to a uniform depth. The foregoing process continues until a desired depth of plating on the substrates has been obtained.

The foregoing process described with respect to the apparatus of FIG. 3 is most suitable for the plating of conductive substrates. However, it will be appreciated that insulative substrates may be plated as well. In order to plate insulative substrates, it is not necessary to alter any of the foregoing plating parameters because even though the surfaces of insulative substrates will become negatively charged by the self-biasing effect, a properly sensed electrical field for accelerating the positive plating ions to the substrates will still be obtained. This is particularly important when both conductive and insulative substrates must be plated in a high volume production environment.

Figure 4:
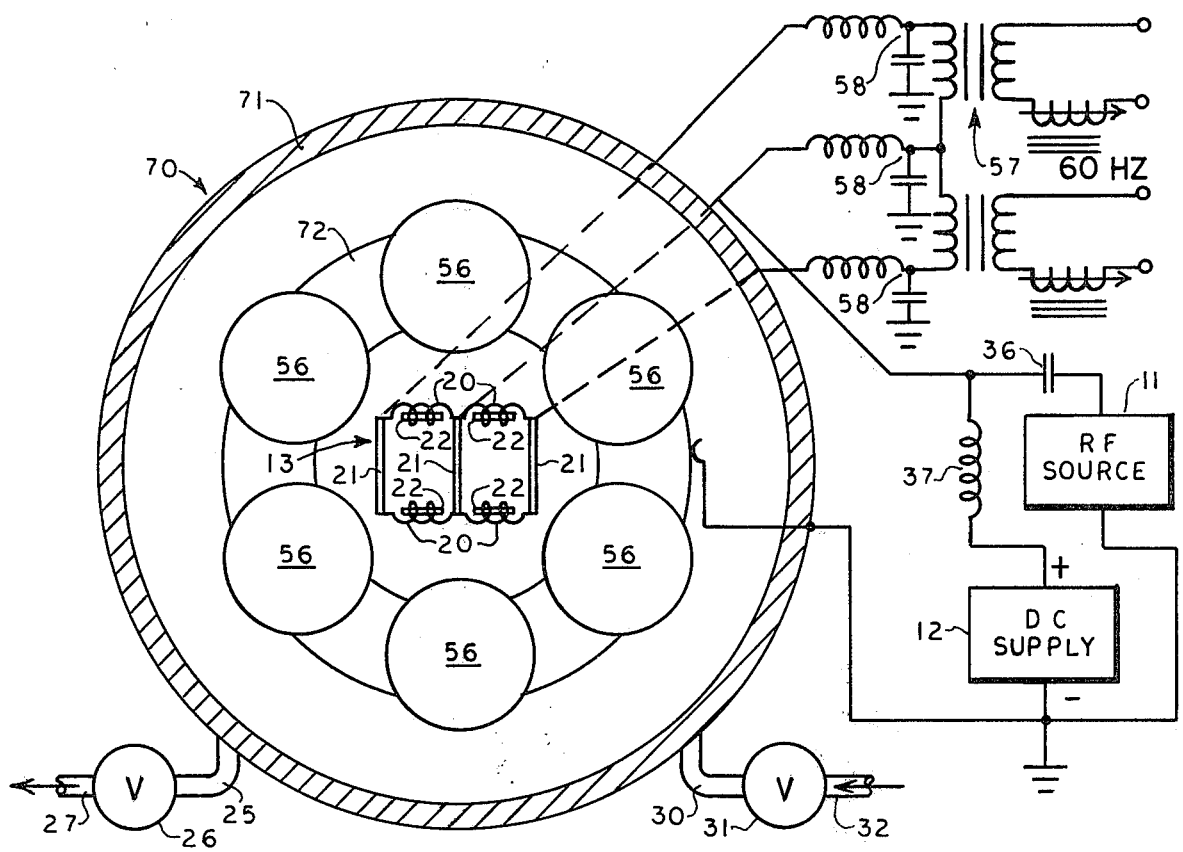
FIG. 4 is a partially schematic vertical sectional view of an apparatus embodying the present invention which may be utilized in practicing the present invention to greater advantage for high volume ion plating.

Referring now to FIG. 4, it illustrates in vertical cross-section an apparatus constructed in accordance with the present invention allowing the invention to be practiced to great advantage in a high volume mass production ion plating environment. The apparatus includes a horizontal cylindrical chamber 70 having an outer annular steel wall 71. Within the chamber 70 there are one or more substrate carriers 72 which are axially spaced apart and generally perpendicular to the chamber center axis. Each of the carriers is ring-shaped and mounted for rotation about the chamber center axis. A plurality of substrates 56 to be plated are mounted to the carriers 72 with clips or the like (not shown). For smaller substrates to be plated, a plurality of the substrates may be loaded into suitable containers or the like and the containers may then be mounted to the substrate carrier. The substrates may also be mounted on the carriers for individual rotation to obtain planetary motion. Along the center axis of the chamber are a plurality of plating sources such as plating source 13. The plating source 13 comprises a plurality of resistance heating elements 20 with each of the elements 20 supporting plating material 22. The elements 20 are supported by a plurality of conductive supports 21 which take the form of copper rods. A transformer 57 is provided to apply 60 hertz alternating current to the conductive supports 21 through suitable filters 58 to effect heating of the resistance heating elements and vaporization of the plating material 22.

The center conductive support 21 is also coupled to the radio frequency energy source 11 through the capacitor 36 and to the direct current voltage supply 12 through the inductor 37. By virtue of the fact that a plurality of resistance heating elements 20 are provided, the plating source 13 of FIG. 4 is adapted to provide a high concentration of the vaporized plating material within the chamber to in turn afford the formation of positive plating ions to a degree suitable for high rate plating necessary in high volume plating environments.

The operation of the apparatus of FIG. 4 proceeds as described for the embodiments of FIGS. 1 and 3. To that end, the valves 26 and 31 are provided for evacuating the chamber 70 and admitting an inert gas into the chamber.

This arrangement greatly simplifies the practical adaptation of gasless ion plating for high volume production environments. The electrical lines of force of the electrical field between the plating source 13 and substrates 56 with the development of a positive direct current bias on the plating source relative to the substrates will be virtually identical to that obtained with the prior art application of a negative direct current bias to the substrates. However, with the prior processes previously noted, not only was it necessary to electrically isolate the substrates from the chamber, but a further electrical field was also generated between the substrates and the grounded chamber. Because the chamber and the substrate supporting structure are both at ground potential (and also the substrates when conductive) this further electrical field has been eliminated by virtue of the present invention. This further electrical field contributed little to the ion plating process. As a result, the present invention allows the development of the useful electrical fields within the chamber while eliminating those fields which are not useful to ion plating. The present invention therefore provides an improved process and apparatus for plating a substrate by gasless ion plating by eliminating the prior need to isolate the substrates from any portion of the chamber.

Figure 5:
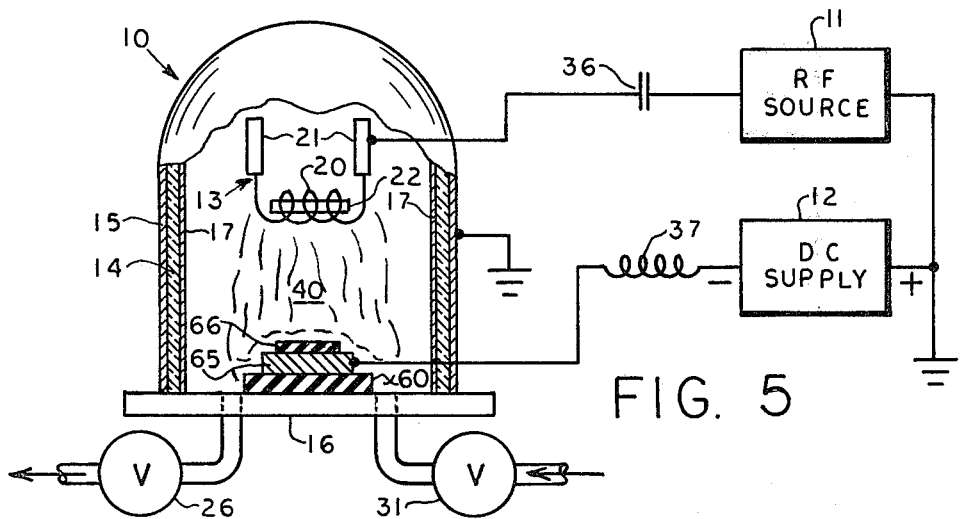
FIG. 5 is a generally schematic representation of a gasless ion plating apparatus in accordance with a still further embodiment of the present invention.

Referring now to FIG. 5, it illustrates a further embodiment of the present invention. Again, a chamber 10 is provided having a glass bell jar 14 with an outer metallic shield 15 and an inner conductive coating 17. The metallic shield 15 is coupled to ground potential.

Within the chamber 10 there is disposed a plating source 13 having a resistance heating element 20 which is supported by conductive supports 21. The resistance heating element 20 in turn supports the plating material 22. Resting upon the bottom wall 16 of the chamber 10 is an insulator pad 60 which supports a conductive substrate support 65, which supports a substrate 66 which may be conductive or insulative.

One of the conductive supports 21 is coupled to a radio frequency energy source 11 through the capacitor 36. The substrate support 65 is coupled to the negative terminal of a direct current voltage supply 62 through the inductor 37.

The apparatus of FIG. 5 also includes the metering valve 26 which is coupled to a vacuum pump (not shown) for evacuating the interior of the chamber 10. The valve 31 is also provided for admitting inert gas to the interior of the chamber 10 should cleaning of the substrate 65 be necessary prior to the plating process.

The operation of the apparatus of FIG. 5 is substantially identical to the operation of the apparatuses of FIGS. 1-4 except that instead of impressing a positive direct current voltage on the plating source 13, a negative direct current bias is impressed upon the substrate support 65. During the plating process, the negative direct current bias on the substrate support 65 and on the self biasing effect of an insulative substrate causes the development of a positive direct current bias of the plating source 13 relative to the substrate 66 which in turn develops the positive plating ion accelerating field for accelerating the positive plating ions within the plasma 40 toward the substrate 66 for plating thereon. While in this embodiment it is necessary to electrically isolate the substrate support 65 from the chamber 10, it will be noted that by coupling the radio frequency energy source 11 to the plating source 13, the prior art problems of applying radio frequency energy to the substrates to be plated is still avoided. Hence, while practicing the present invention in accordance with the embodiment of FIG. 5 is not as convenient as with the embodiments of FIGS. 1-4, the embodiment of FIG. 5 still represents a significant improvement in the gasless ion plating art.

From the foregoing, it will be appreciated that the present invention provides a new and improved gasless ion plating process and method. The process and apparatus of the present invention allows high volume mass production plating of substrates which is substantially easier to implement than with prior processes by virtue of the fact that the substrates to be plated need no longer be electrically isolated from the apparatus chamber. Furthermore, the application of radio frequency energy to the individual substrates to be plated is no longer necessary and, in accordance with the present invention, may be applied to the plating source alone to further greatly simplify the adaptation of gasless ion plating to high volume plating environments.

While the process being practiced is referred to as "gasless ion plating," it should be recognized that a low pressure of a reactive gas may be utilized to produce special coatings. For example, if a coating of aluminum oxide is desired, aluminum oxide material may be loaded into the evaporation source. When the aluminum oxide material is vaporized and subsequently ionized, some of the oxygen will form atomic or molecular oxygen and exit the chamber through the vacuum pump. Therefore, a low pressure input of oxygen gas is desired to replace that having escaped. An alternate deposition technique would be to use aluminum material in the evaporation source and by introducing oxygen into the chamber during the plating process to allow the aluminum oxide to form in the plasma or on the substrate surface. Similar techniques may be used to form nitrides, carbides, etc. In general, a partial pressure of reactive gas of $5 \times 10^{-4}$ T is sufficient for reactive or make up gas plating.

Also, a low pressure back fill with argon, again to a pressure of approximately $5 \times 10^{-4}$ T, can be helpful in at least two ways. Firstly, since the ionization in the plasma is a direct function of the density of molecules in the chamber, it is obvious that little ionization takes place as the evaporation source is warming up. Then, the first vaporized material will likely have less adhesion because of the small percentage of ionization. The presence of a small amount of argon can alleviate this by defining the plasma and creating a higher molecule density at the start of the deposition. The argon may be eliminated once deposition has begun. Secondly, although gasless ion plating does yield three-dimensional coverage, a higher degree of uniformity over severely irregular surfaces may be obtained by using a low pressure of an inert gas, such as argon.

While particular embodiments of the present invention have been shown and described, it will be appreciated by those skilled in the art that changes and modifications may be made. It is therefore intended to cover in the appended claims all such changes and modifications which fall within the true spirit and scope of the invention.

We claim:

1. A process for ion plating a substrate supported by a support means within a chamber with a plating material from a plating source comprising the steps of: evacuating said chamber; coupling said chamber and said support means to ground potential; applying radio frequency energy to said plating source; developing a direct current positive bias on said plating source; and vaporizing plating material in the evacuated chamber from the plating source to create a plasma of plating ions about said substrate.

2. A process as defined in claim 1, wherein the step of developing a direct current positive bias on said plating source comprises the steps of providing a direct current positive bias source and coupling said bias source to said plating source.

3. A process as defined in claim 1, wherein said step of applying radio frequency energy to said plating source comprises the steps of providing a radio frequency source and coupling said radio frequency source to said plating source.

4. A process as defined in claim 1, wherein the substrate is to be cleaned prior to plating, further comprising the preliminary steps of: evacuating said chamber; introducing an inert gas into said chamber; and applying a radio frequency field to an area within said chamber.

5. A process as defined in claim 4, wherein said radio frequency field is applied to an area within said chamber by applying radio frequency energy to said plating source.

6. A process as defined in claim 1, wherein said direct current positive bias on said plating source is developed by establishing a positive bias on said plating source with respect to the surface of said substrate.

7. A process as defined in claim 1, wherein the step of developing a direct current positive bias on said plating source comprises the step of applying a direct current negative bias to said substrate.

8. A process as defined in claim 1, wherein the substrate to be plated is supported within said chamber on a conductive support, and wherein the step of developing a direct current positive bias on said plating source comprises the step of applying a direct current negative bias on said substrate support.

9. A process as defined in claim 1, comprising the further step of introducing a reactive gas into said chamber during the plating process for plating said substrate with a compound formed from the material from the plating source and the reactive gas.

10. A process as defined in claim 1, further comprising the step of introducing an inert gas into said chamber during the plating process.

11. A process for ion plating a substrate within a chamber with a plating material from a plating source comprising the steps of: evacuating said chamber; applying radio frequency energy to said plating source; developing a direct current positive bias on said plating source; and vaporizing plating material in the evacuated chamber from the plating source to create a plasma of plating ions about said substrate; wherein said plating source comprises a resistance heating element and wherein said radio frequency energy is applied directly to said resistance heating element.

12. A process for ion plating a substrate within a chamber with a plating material from a plating source comprising the steps of: evacuating said chamber; applying radio frequency energy to said plating source; developing a direct current positive bias on said plating source; and vaporizing plating material in the evacuated chamber from the plating source to create a plasma of plating ions about said substrate; wherein said plating source comprises a resistance heating element and conductive support means supporting said resistance heating element within said chamber, and wherein said step of applying said radio frequency energy to said source includes the step of applying said radio frequency energy to said support means.

13. A process for ion plating a plurality of substrates supported by support means within a chamber with a plating material, wherein an electrical field is developed between the substrates and a plating source for accelerating positive ions towards the substrates while eliminating the heretofore required electrical isolation between the substrate supporting means and any portion of the chamber, said process comprising the steps of: evacuating said chamber; coupling said chamber and said support means to ground potential; applying radio frequency energy to said plating source; developing a direct current positive voltage on said plating source to develop an electrical field between said plating source and the substrates for accelerating the positive plating ions toward the substrates; and vaporizing plating material in the evacuated chamber from said plating source to form a plasma of positive plating ions within said chamber.

14. A process as defined in claim 9, wherein the step of applying a direct current positive voltage to the plating source comprises the steps of providing a direct current positive voltage source and coupling said voltage source to said plating source.

15. A process as defined in claim 13, wherein said step of applying radio frequency energy to said plating source comprises the steps of providing a radio frequency source and coupling said radio frequency source to said plating source.

16. A process as defined in claim 13, wherein the substrates are to be cleaned prior to plating, further comprising the preliminary steps of evacuating said chamber; introducing an inert gas into said chamber; and applying a radio frequency field to an area within said chamber.

17. A process as defined in claim 16, wherein said radio frequency field is applied to an area within said chamber by applying radio frequency energy to said plating source.

18. A process as defined in claim 13, comprising the further step of varying the orientation of said substrates relative to said plating source during the plating process.

19. A process as defined in claim 13, comprising the further step of introducing a reactive gas into said chamber during the plating process for plating said substrate with a compound formed from the material from the plating source and the reactive gas.

20. A process as defined in claim 13, further comprising the step of introducing an inert gas into said chamber during the plating process.

21. A process for ion plating a plurality of substrates within a chamber with a plating material, wherein an electrical field is developed between the substrates and a plating source for accelerating positive ions towards the substrates while eliminating the heretofore required electrical isolation between the substrate supporting means and any portion of the chamber, said process comprising the steps of: evacuating said chamber; applying radio frequency energy to said plating source; developing a direct current positive voltage on said plating source to develop an electrical field between said plating source and the substrates for accelerating the positive plating ions toward the substrates; and vaporizing plating material in the evacuated chamber from said plating source to form a plasma of positive plating ions within said chamber, wherein said plating source comprises a resistance heating element and wherein said radio frequency energy is applied directly to said resistance heating element.

22. A process for ion plating a plurality of substrates within a chamber with a plating material, wherein an electrical field is developed between the substrates and a plating source for accelerating positive ions towards the substrates while eliminating the heretofore required electrical isolation between the substrate supporting means and any portion of the chamber, said process comprising the steps of: evacuating said chamber; applying radio frequency energy to said plating source; developing a direct current positive voltage on said plating source to develop and electrical field between said plating source and the substrates for accelerating the positive plating ions toward the substrates; and vaporizing plating material in the evacuated chamber from said plating source to form a plasma of positive plating ions within said chamber, wherein said plating source comprises a resistance heating element and conductive support means supporting said resistance heating element within said chamber, and wherein said step of applying said radio frequency energy to said source includes the step of applying said radio frequency energy to said support means.

23. An apparatus for plating a substrate with a plating material comprising: a chamber adapted to enclose said substrate; means for supporting said substrate within said chamber, wherein said chamber and said means for supporting are coupled to ground potential; plating source means within said chamber for vaporizing plating material therein; means for evacuating said chamber; radio frequency signal generating means coupled to said plating source means for applying radio frequency energy to said plating source means to form a plasma of positive plating ions from said vaporized plating material; and means for developing an electrical field between said plating source means and said substrate for accelerating said positive plating ion towards said substrate.

24. An apparatus as defined in claim 23, wherein said radio frequency signal generating means is external to said chamber.

25. An apparatus as defined in claim 24, further comprising capacitance means coupling said radio frequency signal generating means to said plating source means.

26. An apparatus as defined in claim 23, wherein said means for developing said electrical field comprises a voltage source means external to said chamber.

27. An apparatus as defined in claim 23, further comprising means for varying the orientation of said substrate with respect to said plating source means.

28. An apparatus for for plating a substrate with a plating material comprising: a chamber adapted to enclose said substrate; plating source means within said chamber for vaporizing plating material therein; means for evacuating said chamber; radio frequency signal generating means coupled to said plating source means for applying radio frequency energy to said plating source means to form a plasma of positive plating ions from said vaporized plating material; means for developing an electrical field between said plating source means and said substrate for accelerating said positive plating ions towards said substrate, wherein said means for developing said electrical field comprises a voltage source means external to said chamber; and inductance means coupling said voltage source means to said plating source means.

29. An apparatus for plating a substrate with a plating material comprising: a chamber adapted to enclose said substrate; plating source means within said chamber for vaporizing plating material therein, wherein said plating source means comprises a resistance heating element; means for evacuating said chamber; radio frequency signal generating means coupled to said plating source means for applying radio frequency energy to said plating source means to form a plasma of positive plating ions from said vaporized plating material; and means for developing an electrical field between said plating source means and said substrate for accelerating said positive plating ions towards said substrate.

30. An apparatus as defined in claim 29, wherein said means for developing said electrical field comprises a voltage source means and wherein said radio frequency signal generating means and said voltage source are coupled to said resistance heating element.

31. An apparatus as defined in claim 29, wherein said plating source means further comprises conductive support means for supporting said resistance heating element within said chamber and wherein said radio frequency signal generating means is coupled to said conductive support means.

32. An apparatus as defined in claim 31, wherein said means for developing said electrical field comprises voltage source means, and wherein said voltage source means is also coupled to said conductive support means.

33. An apparatus for plating a substrate with a plating material comprising: a chamber adapted to contain said substrate and said plating material; means for supporting said substrate, wherein said chamber and said means for supporting are coupled to ground potential; means for evacuating said chamber; vaporizing means for vaporizing said plating material; means for applying radio frequency energy to said vaporizing means for forming a plasma of plating ions from the vaporized plating material; and means for developing a positive direct current bias on said vaporizing means for forming an electrical field within said chamber for accelerating said plating ions to said substrate.

34. In an apparatus for ion plating a plurality of substrates with positive plating ions from a plating source, wherein the substrates are supported by support means and enclosed within an evacuatable chamber, and wherein the chamber and the substrate support means are coupled to ground potential and an electrical field is developed between the substrates and the plating source for accelerating the positive ions to the substrates, an improved arrangement for creating a plasma of the positive plating ions and the ion acceleration electrical field while eliminating the heretofore required electrical isolation between the substrates and any portion of the chamber, said improvement comprising: radio frequency signal generating means coupled to the plating source for forming the plasma of positive plating ions and positive direct current voltage source means coupled to the plating source for impressing a positive direct current bias on the plating source for developing the ion acceleration field.

35. A process for ion plating a substrate supported by a support means within a chamber with a plating material comprising the steps of: evacuating said chamber; coupling said chamber and said support means to ground potential; vaporizing plating material in the evacuated chamber from a plating source; applying radio frequency energy to said plating source to create a plasma of plating ions about said substrate; and developing a direct current positive bias on said plating source relative to said substrate by developing a direct current negative bias on said substrate.

36. A process for ion plating a substrate within a chamber with a plating material from a plating source comprising the steps of: evacuating said chamber; coupling said chamber to ground potential; electrically isolating said substrate from said chamber; applying radio frequency energy to said plating source; developing a direct current negative bias on said substrate by attachment of the negative side of a direct current source; and vaporizing plating material in the evacuated chamber from the plating source to create a plasma of plating ions about said substrate.

37. A process as defined in claim 36, wherein the substrate is electrically isolated from the chamber by the interposition of a non-conductive pad means.

38. An apparatus for plating a substrate with a plating material comprising: a chamber adapted to enclose said substrate wherein said chamber is coupled to ground potential; non-conductive means for supporting and electrically isolating said substrate within said chamber; plating source means within said chamber for vaporizing plating material; means for evacuating said chamber; radio frequency signal generating means coupled to said plating source means for applying radio frequency energy to said plating source means to form a plasma of positive plating ions from said vaporized plating material; and means connected to said substrate for developing an electrical field for accelerating said positive plating ions towards said substrate.

39. An apparatus as defined in claim 38, wherein said means for developing an electrical field includes a voltage source means external to said chamber.

40. An apparatus as defined in claim 39, wherein said voltage source means is connected to said substrate support means through an inductance means.

* * * * *